United States Patent [19]
Yamazaki

[11] Patent Number: 5,266,363
[45] Date of Patent: Nov. 30, 1993

[54] PLASMA PROCESSING METHOD UTILIZING A MICROWAVE AND A MAGNETIC FIELD AT HIGH PRESSURE

[75] Inventor: Shunpei Yamazaki, Tokyo, Japan

[73] Assignee: Semiconductor Energy Laboratory Co., Ltd., Kanagawa, Japan

[21] Appl. No.: 966,562

[22] Filed: Oct. 26, 1992

Related U.S. Application Data

[60] Continuation of Ser. No. 470,440, Jan. 22, 1990, abandoned, which is a continuation of Ser. No. 178,362, Apr. 6, 1988, abandoned, which is a division of Ser. No. 114,203, Oct. 29, 1987, abandoned.

[30] Foreign Application Priority Data

Nov. 10, 1986 [JP] Japan ................. 61-266834
Jan. 5, 1987 [JP] Japan ................. 62-298

[51] Int. Cl.$^5$ .................................... B05D 3/06
[52] U.S. Cl. .................. 427/571; 427/575; 427/577; 427/248.1
[58] Field of Search ........... 427/571, 575, 577, 255.2, 427/248.1

[56] References Cited

U.S. PATENT DOCUMENTS

| | | | |
|---|---|---|---|
| 4,869,923 | 9/1989 | Yamazaki | 427/38 |
| 4,973,494 | 11/1990 | Yamazaki | 427/39 |
| 5,015,494 | 5/1991 | Yamazaki | 427/39 |

FOREIGN PATENT DOCUMENTS 0063732 4/1984 Japan .
0036200 2/1986 Japan .
0158898 7/1986 Japan .

OTHER PUBLICATIONS

Kawarada et al. "Large Area Chemical Vapor Deposition of Diamond Particles and Films Using Magneto-Microwave Plasma", Japanese Journal of Applied Physics, vol. 26, No. 6, Jun., 1987, pp. LL 1032-1034.

*Primary Examiner*—Michael Lusignan
*Assistant Examiner*—Benjamin L. Utech
*Attorney, Agent, or Firm*—Sixbey, Friedman, Leedom & Ferguson

[57] ABSTRACT

A plasma processing deposition method for forming a material on a substrate is disclosed. The method includes inputting a reactive gas into a reaction chamber, admitting a microwave into the reaction chamber at a predetermined frequency and in a predetermined direction, establishing a magnetic field in the reaction chamber where the direction of the magnetic field is substantially parallel to the direction of the propagation of the microwave and the strength of the magnetic field causes cyclotron resonance at approximately the position where the substrate is held in the reaction chamber, exhausting the reaction chamber to establish a predetermined pressure within the chamber and depositing the material on a surface of the substrate. This method may further include holding the substrate approximately at the predetermined cyclotron resonance position within the reaction chamber in order to readily deposit the material on the surface of the substrate.

6 Claims, 4 Drawing Sheets

- × 0.05
- ■ 0.1
- ◆ 0.15
- ✳ 0.2
- ✱ 0.25
- ☐ 0.3
- ◇ 0.35
- + 0.4
- × 0.45

$|B_1|$ (Gauss)

- ✱ 5000
- ☐ 10000
- ◇ 15000
- + 20000
- × 25000

$|E|$ (V/m)

PLASMA PROCESSING METHOD UTILIZING A MICROWAVE AND A MAGNETIC FIELD AT HIGH PRESSURE

This application is a continuation of Ser. No. 07/470,440, filed Jan. 22, 1990, now abandoned, which itself was a continuation of Ser. No. 07/178,362, filed Apr. 6, 1988, abandoned, which was a divisional of Ser. No. 07/114,203, filed Oct. 29, 1987, abandoned.

BACKGROUND OF THE INVENTION

This invention relates to a microwave enhanced method and an apparatus therefor.

Recently, ECR CVD has attracted the interests of researchers as a new method of manufacturing thin films, particularly amorphous thin films. For example, Matsuo et al discloses one type of such a ECR CVD apparatus in U.S. Pat. No. 4,401,054. This recent technique utilizes microwaves to energize a reactive gas into a plasma state by virtue of a magnetic field which functions to pinch the plasma gas within the excitation space. With this configuration, the reactive, gas can absorb the energy of the microwaves. A substrate to be coated is located distant from the excitation space (resonating space) for preventing the same from being spattered. The energized gas is showered on the substrate from the resonating space. In order to establish an electron cyclotron resonance, the pressure in a resonating space is kept at $1 \times 10^{-3}$ to $1 \times 10^{-5}$ Torr at which electrons can be considered as independent particle and resonate with a microwave in an electron cyclotron resonance on a certain surface on which the magnetic field takes a particular strength required for ECR. The excited plasma is extracted from the resonating space, by means of a divergent magnetic field, to a deposition space which is located distant from the resonating space and in which is disposed a substrate to be coated.

In such a prior art method, it is very difficult to form a thin film of a polycrystalline or single-crystalline structure, so that currently available methods are almost limited to processes for manufacturing amourphous films. Also, high energy chemical vapor reaction is difficult to take place in accordance with such a prior art and therefore a diamond film or other films having high melting points, or uniform films on an even surface having depressions and caves can not be formed.

SUMMARY OF THE INVENTION

It is therefore an object of the invention to provide a microwave enhanced CVD method and an apparatus therefor capable of forming a film, which can not be formed by prior art, such as a diamond film, or a film of a material having a high melting point.

According to one aspect of the invention, the surface of an object to be coated is located in a region of a resonating space in which electric field of a microwave takes its maxmum value. By this configuration, the deposition can be carried out while the deposited film is being partially sputtered, and therefore, e.g., a diamond film can be formed.

According to another aspect of the invention, a new CVD process has been culminated. The new process utilizes a mixed cyclotron resonance which was dirived firstly by the inventors. In the new type of exciting process, interaction of reactive gas itself must be taken into consideration as a non-negligible perturbation besides magnetic field and microwave, and therefore charged particles of a reactive gas can be absorbed in a relatively wide resonating space. For the mixed resonance, the pressure in a reaction chamber is elevated $10^2$–$10^5$ times as high as that of prior art.

DETAILED DESCRIPTION OF THE PREFERRED EMBODIMENTS

Figure 1:
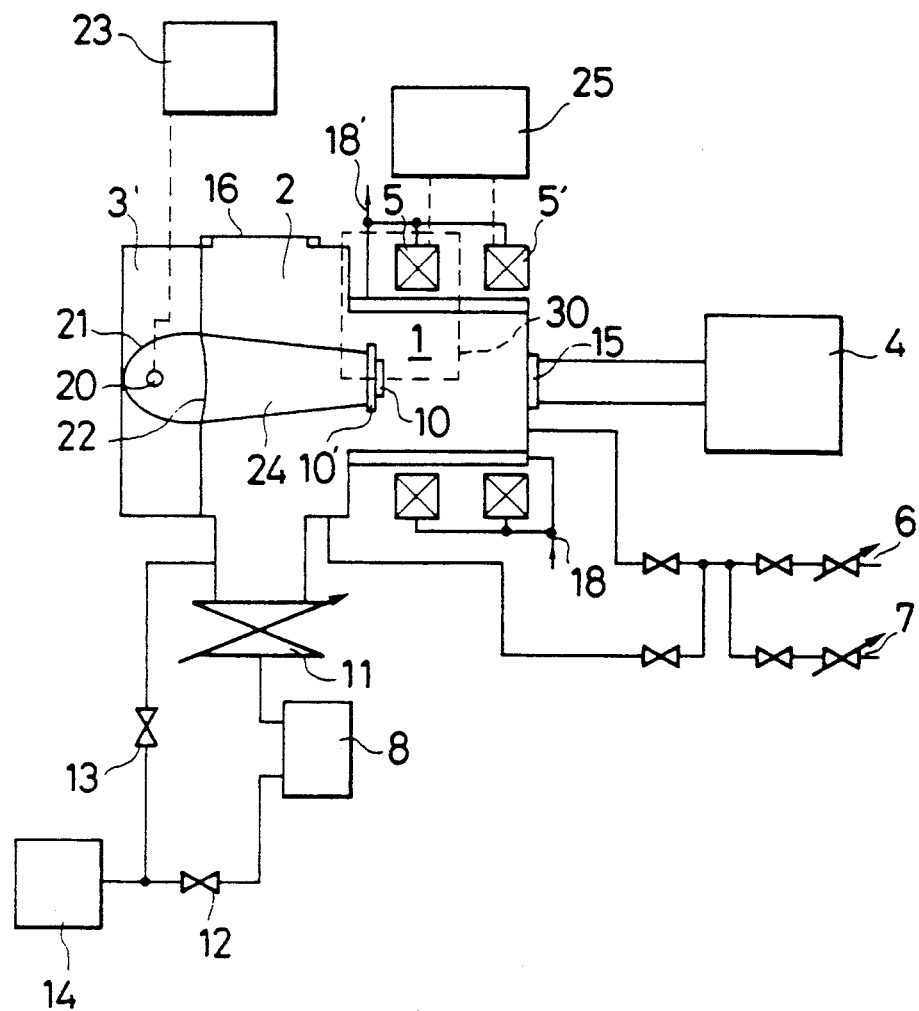
FIG. 1 is a cross section view showing a CVD apparatus in accordance with the present invention.

Referring to FIG. 1, a microwave enhanced plasma CVD apparatus in accordance with the present invention is illustrated. In the figure, the apparatus comprises a reaction chamber in which a plasma generating space 1 and an auxiliary space 2 are defined and can be held at an appropriate pressure, a microwave generator 4, electro-magnets 5 and 5' in the form of solenoids surrounding the space 1, a power supply 25 for supplying and electric power to the electro-magnets 5 and 5', and a water cooling system 18. The plasma generating space 1 has a circular cross section. In the plasma generating space 1, a substrate holder 10' made of a highly thermal conductive ceramic such as aluminium nitride is provided on which a substrate 10 is mounted. The substrate holder 10' is irradiated and heated to 150°–1000° C. with an infrared light 24, which is emitted from an IR heater 20, reflected from an IR reflection parabola mirror 21 and focused on the back surface of the holder 10' through a lens 22. A reference numeral 23 designates a power supply for the IR heater 20. Provided for evacuating the reaction chamber is an evacuating system comprising a turbo molecular pump 8 and a rotary pump 14 which are connected with the reaction chamber through pressure controlling valves 11, 12 and 13. The substrate temperature may reach a sufficient value only with the plasma gas generated in the reaction chamber. In the case, the heater can be dispensed with. Further, depending on the condition of the plasma, the substrate temperature might elevate too high to undergo a suitable reaction. In the case, cooling means has to be provided. The process with this apparatus is carried out as follow.

A substrate 10 is mounted on the substrate holder 10' and heated by infrared light 24 to 500° C. Then, hydrorien gas is introduced from a gas introducing system 6 at 10 SCCM, and a microwave of 1 Kilo Gauss or stronger, e.g., 2.45 GHz is emitted from the microwave generator thourgh a microwave introduction window 15 to the plasma generating space 1 which is subjected to an magnetic field of about 2K Gauss induced by the magnets 5 and 5'. The hydrogen is excited in a high density plasma state in the space 1 by the energy of the microwave. The surface of the substrate is cleaned by high energy electrons and hydrogen atoms. In addition to the introduction of the hydrogen gas, $C_2H_2$ and $CH_4$ are inputted through a introduction system 7, and excited by the energy of microwave at 1–800 Torr in the same manner as carried out with hydrogen explained in the foregoing description. As a result of a chemical vapor reaction, carbon is deposited in the form of a diamond film or an i-carbon (insulated carbon) film. The i-carbon is comprised of a mixture of diamond and amorphous carbon.

Figure 2A:
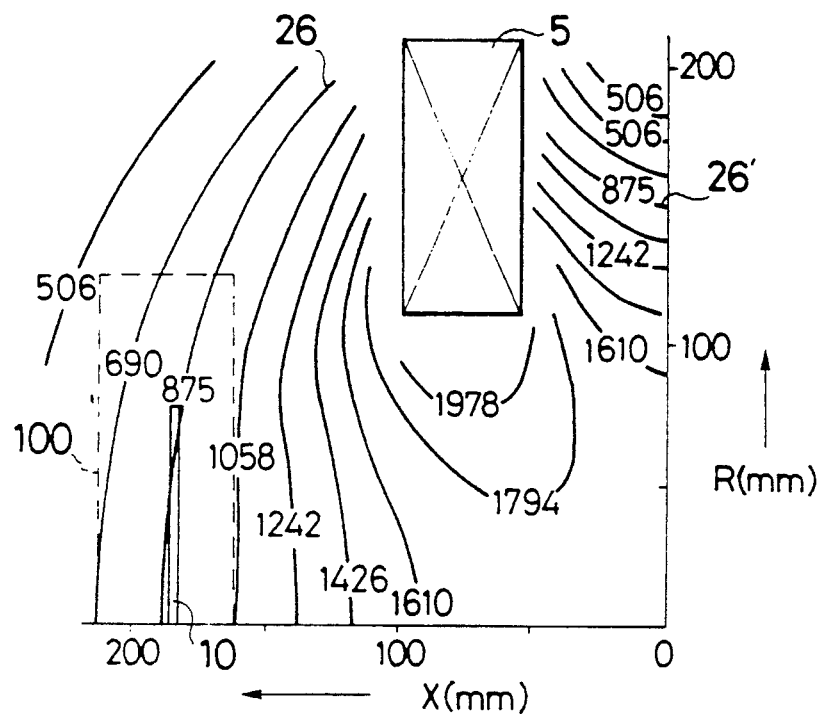
FIG. 2(A) is a graphical diagram showing the plofile of the equipotential surfaces of magnetic field in cross section.
Figure 2B:
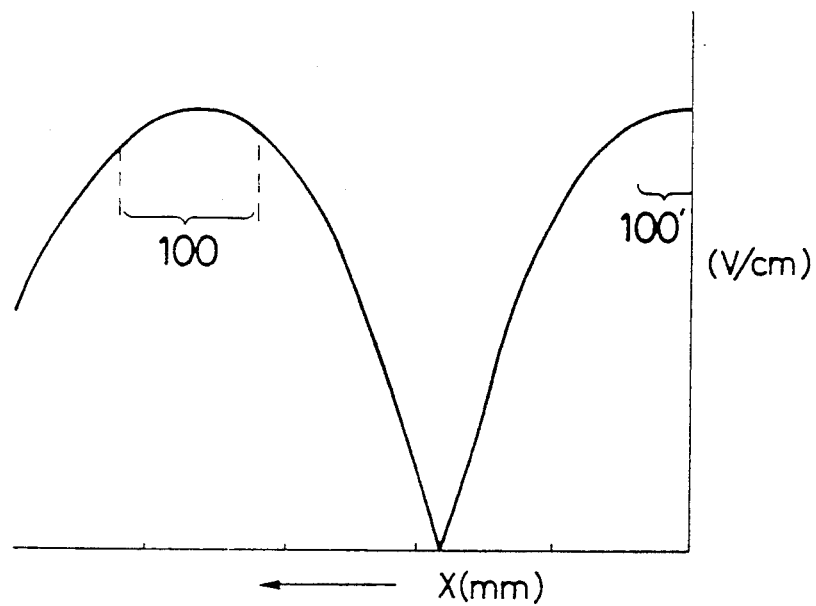
FIG. 2(B) is a graphical diagram showing the strength of electric field.
Figure 3A:
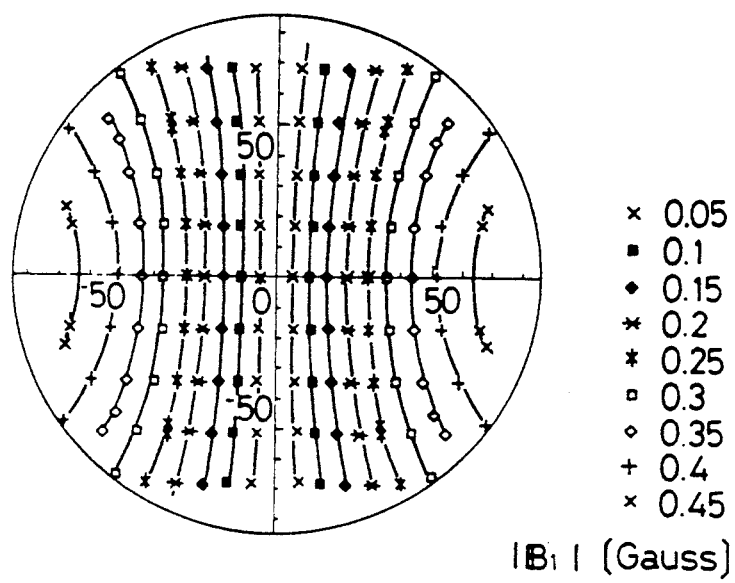
FIGS. 3(A) and 3(B) are graphical diagrams showing equipotential surfaces in terms of magnetic field and electric field respectively.
Figure 3B:
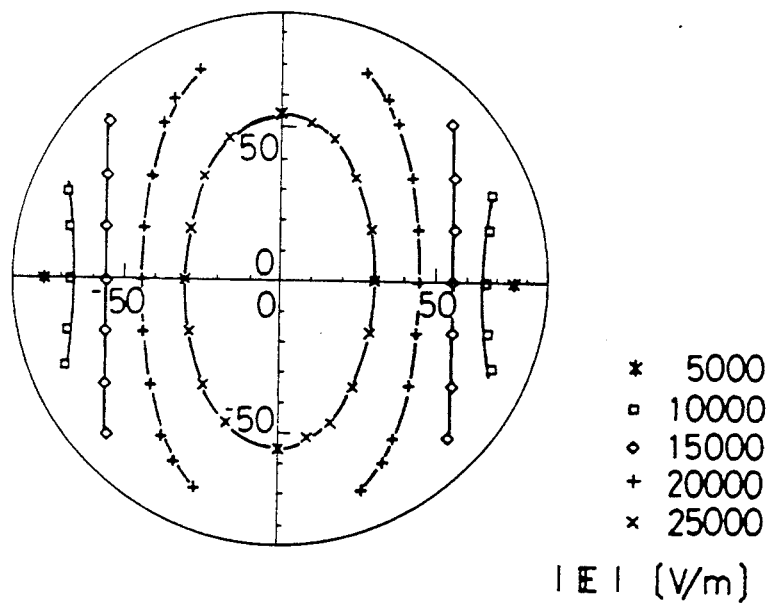

FIG. 2(A) is a graphical diagram showing the distribution of magnetic field on the region 30 in FIG. 1. Curves on the diagram are plotted along equipotential surfaces and marked with the strength values of the magnetic field induced by the magnet 5 having a power of 2000 Gauss. By adjusting the power of the magnets 5 and 5', the strength of the magnetic field can be controlled so that the magnetic field becomes largely uniform over the surface to be coated which is located in the region 100 where the magnetic field (875±185 Gauss) and the electric field interact. In the diagram, a reference 26 designates the equipotential surface of 875 Gauss at which ECR (electron cyclotron resonance) condition between the magnetic field and the frequency of the microwave is sutisfied. Of course, in accordance with the present invention, ECR can not be established due to the high pressure in the reaction chamber, 1–800 Torr, but instead a mixed cyclotron resonance (MCR) takes place in a broad region including the equipotential surface of the ECR condition. FIG. 2(B) is a graphical diagram corresponding to FIG. 2(A) and shows the strength of a standing wave of the electric field of the microwave in the plasma generating space 1. The strength of the electric field takes its maximum value in the regions 100 and 100'. However, in the region 100', it is difficult to heat the substrate 10' without disturbing the propagation of the microwave. In other region. a film is not uniformly deposited, but deposited the product in the form of a doughnut. It is for this reason that the substrate 10 is disposed in the reason 100. The plasma flows in the lateral direction. According to the experimental, a uniform film can be formed on a circular substrate having a diameter of less than 100 mm. Preferably, a film is formed in the chamber on a circular substrate having a diameter of less than 50 mm with a uniform thickness and a unifor quality. When a larger substrate is desired to be coated, the diameter of the space 2 can be double by making use of 1.225 GHz as the frequency of the microwave. FIGS. 3(A) and 3(B) are graphical diagrams showing the distributions of the magnetic field and the electric field on a cross section of the plasma generating space 1. The curves ploted in the circles of the figures correspond equipotential surfaces. As shown in FIG. 3(B), the electric field reaches its maxmum value at 25 KV/m.

The diffraction images of films formed in accordance with the present invention were obtained. As results, halo patterns were obserbed together with spots indicating the existence of diamond. The halo patterns gradually, which corresponds to an amorphous state, disappear as the substrate temperature elevates, and when the temperature rises beyond 650° C. the film became a diamond. At less than 150° C., i-carbon film could not be formed. For reference, a film formation process was performed in the same manner as in the above but without using a magnetic field. As a result, a graphite film was deposited.

In the same manner, polycrystalline silicon carbide films, and aluminium nitride films can be formed by making use of methyl silane, and alminium compound gas and ammonia gas respectively as a reactive gas. Further, other films having high melting points of tungsten, titanium, molybdenum or their silicon compounds can be formed in the similar manner.

Figure 4:
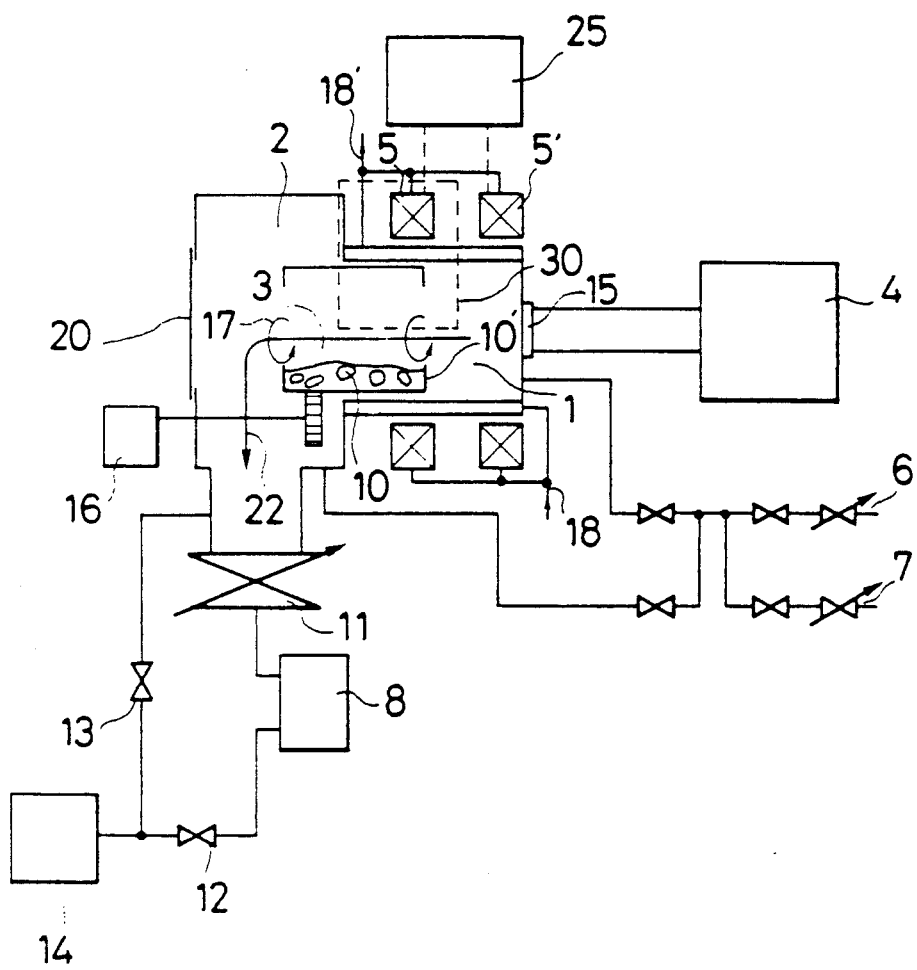
FIG. 4 is a cross section view showing another embodiment in accordance with the present invention.

Referring to FIG. 4, another embodiment of the invention is illustrated. In the figure, the apparatus comprises a reaction chamber in which a plasma generating space 1 and an auxiliary space 2 are defined and can be held at an appropriate pressure, a microwave genarator 4, electro-magnets 5 and 5' which are supplied with electric power from a power supply 25, and a water cooling system 18. The plasma generating space 1 has a circular cross section. In the plasma generating space 1, a hollow cylinder 10' having inward-turned brims is rotatably supported in the space so that a microwave emitted from the microwave generator 4 passes through the cylinder along its axis. The cylinder 10' is made of a stainless steel or a quartz and turned by means of a motor 16 through a gear. Provided for evacuating the reaction chamber is a evacuating system comprising a turbo molecular pump 8 and a rotary pump 14 which are connected with the reaction chamber through pressure controlling valves 11, 12 and 13. The process with this apparatus is carried out as follow.

Objects 10 to be coated, for example, metallic, plastic, ceramic parts (such as gears, screws, ornament jigs, or micro-particles for grinding) are put in the cylinder 10' and turned at 0.1-10 rpm during process. The cylinder 10', although the means is not illustrated in the figure, is shaken by micro-vibration of 100 Hz–10 KHz. By the turning and the vibration, the surfaces of the objects exposed to the surrounding are always switching during process. The reaction chamber is evacuated by the turbo molecular pump 8 and the rotary pump to $1 \times 10^{-6}$ Torr or lower. Then, argon, helium or hydrogen as a non-productive gas is introduced to the reaction chamber from a gas introducing system 6 at 30SCCM, and a microwave of 2.45 GHz is emitted from the microwave generator at 500 W through a microwave introduction window 15 to the plasma generating space 1 subjected to an magnetic field of about 2K Gauss induced by the magnets 5 and 5'. The pressure of the non-productive gas is $1 \times 10^{-4}$ Torr. A plasma is generated in the space 1 at a high density by the energy of the microwave. The surfaces of the objects 10 is cleaned by high energy electrons and non-productive atoms. In addition to the introduction of non-productive gas, $C_2H_2$, $C_2H_4$ and/or $CH_4$ are introduced through a introduction system 7 at 1-800 Torr, preferably 3-30 Torr, e.g., 10 Torr, and excited by the energy of microwave in the same manner as carried out with the non-productive gas explained in the foregoing description. As a result of a mixed resonance, carbon is deposited in the form of a diamond film or an i-carbon film on the objects 10. In this embodiment, a heating means as illustrated in FIG. 1 may be used as in FIG. 1.

The distributions of magnetic field and electric field are same as FIGS. 2(A), 2(B), 3(A) and 3(B) explained in conjunction with the preceding embodiment, and therefore redundant description is dispensed with.

The diffraction images of films formed in accordance with the present invention were obtained. As results, halo patterns were obserbed together with spots indicating the existence of diamond. The halo patterns gradually disappear as the substrate temperature elevates, and when the temperature rises beyond 650° C. the film became a diamond. At less than 150° C., i-carbon film could not be formed. For reference, a film formation process was performed in the same manner as in the above but without using a magnetic field. As a result, a graphite film was deposited.

In the same manner, polycrystalline silicon carbide films, and aluminium nitride films can be formed by making use of methylsilane, and alminium compound gas and ammonia gas respectively as a reactive gas. Further, other films having high melting points of tungsten, titanium, molybdenum or their silicon compounds can be formed in the similar manner. For example, a BN or BP film could be formed in accordance with the present invention.

The pressure in the reaction chamber is chosen at that required for ECR condition, so that a preliminary plasma discharge takes place. While the discharge continues, the pressure is changed to 0.1 Torr to 300 Torr where a mixed resonance takes place with a plasma of which particles have a mean free path of 0.05 mm to several milimeters, normally not more than 1 mm.

The process proposed by this invention is suitable for manufacturing superconducting ceramics including one or more rare earth elements, one or more alkaline earth element (including Be and Mg) and Cu. In this case, a process gas is prepared by bubbling a solution of compounds of the elements with oxygen gas. For example, an organic solution (benzene, or alcohol solution) or a water solution of alkylenes or halides of $Y(OC_2H_5)_3$, $Ba(OC_2H_5)_3$ and $CuBr_3$ so that the stoichometric ratio among Y, Ba and Cu is 1:2:3. The stoichometric formula of the deposited product is $YBa_2Cu_3O_{6-8}$. In place of bubbling method, compounds of the elements can be inputted to the rection chamber by blowing the compounds in the form of fine powder with a highly pressurized oxgen gas, so called spraying method.

The invention should not limited to the above particular embodiments and many modifications and variations may cause to those skilled in the art. For example, instead of the hollow cylinder, any hollow member having a cross section of a polygon can be employ. Although the embodiments employ microwave energy alone under the exsitence of magnetic field, photon energy can be applied to the reactive gas excited by a mixed resonance, on a posistion depart from the mixed resonance.

I claim:

1. A plasma processing method of forming a material on a substrate comprising:

inputting a reactive gas into a reaction chamber;
emitting a microwave into said reaction chamber;
establishing a magnetic field in said reaction chamber where the direction of the magnetic field is substantially parallel to the direction of propagation of the microwave and the strength of the magnetic field is such as to cause cyclotron resonance at a position in the reaction chamber;
holding the substrate approximately at said position in the reaction chamber; and
depositing said material on a surface of the substrate, wherein a pressure inside said reaction chamber is maintained sufficiently high to prevent the occurrence of electron cyclotron resonance during said depositing said material.

2. A plasma processing deposition method of forming a material on a substrate comprising the steps of:

inputting a reactive gas into a reaction chamber;
emitting a microwave into said reaction chamber;
establishing a standing wave of said microwave in the reaction chamber;
holding said substrate substantially at a position where said standing wave attains a maximum value;
establishing a magnetic field in said reaction chamber where the direction of the magnetic field is substantially parallel to the direction of propagation of the microwave and the strength of the magnetic field is such as to cause cyclotron resonance at approximately the position where the substrate is held in the reaction chamber; and
depositing said material on a surface of said substrate, wherein a pressure inside said reaction chamber is maintained sufficiently high to prevent occurrence of electron cyclotron resonance during said depositing said material.

3. The method of claim 1 or 2 wherein said pressure is chosen between 3 Torr and 30 Torr.

4. The method of claim 1 or 2 wherein the strength of said magnetic field is at least 1 Kilo Gauss.

5. The method of claims 1 or 2 wherein the frequency of the microwave is 2.45 GHz.

6. The method of claims 1 or 2 wherein the strength of the magnetic field at the position where said substrate is located is 875 Gauss ±185 Gauss.

* * * * *